(12) United States Patent
Kanetani et al.

(10) Patent No.: US 6,356,493 B1
(45) Date of Patent: Mar. 12, 2002

(54) SIGNAL TRANSMISSION CIRCUIT AND SEMICONDUCTOR MEMORY USING THE SAME

(75) Inventors: Kazuo Kanetani, Akishima; Hiroaki Nambu, Sagamihara; Kaname Yamasaki, Kokubunji; Takeshi Kusunoki, Tachikawa; Fumihiko Arakawa, Tokorozawa, all of (JP)

(73) Assignees: Hitachi, Ltd., Tokyo; Hitachi Engineering Co., Ltd., Mobara, both of (JP)

( * ) Notice: Subject to any disclaimer, the term of this patent is extended or adjusted under 35 U.S.C. 154(b) by 0 days.

(21) Appl. No.: 09/636,737

(22) Filed: Aug. 11, 2000

Related U.S. Application Data

(63) Continuation of application No. 09/599,738, filed on Jun. 23, 2000.

(30) Foreign Application Priority Data

Jun. 23, 1999 (JP) .......................................... 11-176286

(51) Int. Cl.$^7$ ................................................ G11C 7/00
(52) U.S. Cl. .................... 365/203; 365/189.02; 365/198
(58) Field of Search ................................. 365/203, 202, 365/198, 190, 191, 189.08

(56) References Cited

U.S. PATENT DOCUMENTS

| | | | |
|---|---|---|---|
| 5,291,076 A | 3/1994 | Bridges et al. ............. 307/449 |
| 5,373,203 A | 12/1994 | Nicholes et al. ............ 326/106 |
| 5,963,467 A | * 10/1999 | Miyatake et al. ........... 365/149 |
| 6,026,047 A | * 2/2000 | Ryu et al. .............. 365/230.06 |
| 6,043,696 A | * 3/2000 | Klass et al. ................. 327/211 |

FOREIGN PATENT DOCUMENTS

JP            10150358        6/1998

* cited by examiner

*Primary Examiner*—Richard Elms
*Assistant Examiner*—Hien Nguyen
(74) *Attorney, Agent, or Firm*—Antonelli, Terry, Stout & Kraus, LLP

(57) ABSTRACT

A transmission circuit for transmitting a data signal between circuit units through a signal wire. The data signal is transmitted for precharging the signal wire to high potential during a precharge period and discharging it to low potential according to data transmitted during an evaluation period or keeping the signal wire as it is. Latch type Source-Coupled-Logic as configured so that a first node and a second node used as an output terminal to the next stage are respectively charged together to high potential during the precharge period. The second node is discharged according to potential at the first node during the evaluation period, and the first node is discharged according to a potential on the signal wire. Thus, the operation of discharging the signal wire by the driver circuit can be sped up.

1 Claim, 15 Drawing Sheets

SIGNAL TRANSMISSION CIRCUIT AND SEMICONDUCTOR MEMORY USING THE SAME

CROSS-REFERENCE TO RELATED APPLICATION

This application is a continuation of application Ser. No. 09/599,738, filed on Jun. 23, 2000, the entire disclosure of which is hereby incorporated by reference.

FIELD OF THE INVENTION

The present invention relates to a transmission circuit which transmits signals between circuit units on a semiconductor integrated circuit, and a semiconductor memory using the same.

BACKGROUND OF THE INVENTION

A transmission circuit capable of transmitting signals at high speed even through a wire long in length and large in parasitic capacitance has been desired for a semiconductor integrated circuit. In the case of a CMOS circuit, a circuit shown in FIG. 18 is known as a conventional transmission circuit. In the same drawing, reference numeral 101 indicates a dynamic CMOS circuit used as a driver circuit. The symbol W indicates an equivalent circuit of a wire in which a parasitic capacitance CL and a parasitic resistance RL are taken into consideration. Reference numeral 200 indicates an inverter used as a receiving circuit. The symbol φ 1 indicates a control signal and the symbol IN indicates a data signal. Operational waveforms of the circuit are illustrated in FIG. 19. When the control signal φ 1 is at a low potential VSS ('L'), a precharge period is set up, whereas when the control signal φ 1 is at a high potential VDD ('H'), an evaluation period is set up. During the precharge period, an output Q1, produced from the driver circuit 101 reaches 'H'. If the data signal IN is 'H' (indicated by a solid line) when the control signal φ 1 changes from 'L' to 'H', then the output Q1 is discharged and changed from 'H' to 'L'. Under the influence of a time interval (CR time constant), obtained from the product of the parasitic capacitance CL and the parasitic resistance RL of the wire W, an output Q1B at the exit of the wire W changes from 'H' to 'L'. Thereafter, the receiving circuit 201 outputs an output Q2 in response to the output Q1B at the exit of the wire W. On the other hand, if the data signal IN is 'L' (indicated by a broken line) when the control signal φ 1 changes from 'L' to 'H', then no outputs Q1 and Q1B are discharged, and they are maintained at 'H'. As the parasitic capacitance of the output part Q1 increases, transistors that are large in gate width are used as transistors for the driver circuit 101, and the time required to charge and discharge the output Q1 is shortened achieved.

SUMMARY OF THE INVENTION

In the conventional transmission circuit, as indicated by the operational waveforms shown in FIG. 19, the time necessary for the output Q1 of the driver circuit 101 to fall is faster, and the delay time (tpd1) thereof is small. However, the waveform is rendered dull due to the influence of the parasitic capacitance and the parasitic resistance at the exit Q1B of the wire W, and the delay time (tcrf) is developed (where the logic threshold potential of the inverter constituting the receiving circuit is supposed to be a common (VDD/2)). The delay time developed due to the influence of the wire increases in proportion to the product of the parasitic capacitance and the parasitic resistance. Therefore, the delay time is long and becomes dominant when the wire is long, and, hence, the performance of the semiconductor integrated circuit is rate-controlled by the delay time developed under the influence of the wire.

Incidentally, a waveform-dull phenomenon is not limited only to the case where the length of the wire is long. There may be cases in which transistors that each have a small gate width, which and are short in wiring length and large in parasitic capacity are used for the driver circuit 101.

With the foregoing problems in view, it is therefore an object of the present invention to shorten the time required to transmit a data signal, even when a signal waveform is made dull.

Another object of the present invention is to shorten the precharge time at an exit portion of a signal wire (transmission line) and to shorten the transmission cycle time.

According to one aspect of the present invention, in order to achieve the above objects, there is provided a transmission circuit, comprising a driver circuit alternately controlled to a precharge period and an evaluation period according to a first control signal. This driver circuit precharges an output node to a first source potential during the precharge period and drives the output node to either the first source potential or the second source potential, according to a potential at an input node during the evaluation period The transmission circuited comprises a signal line coupled to the output node of the driver circuit so as to be driven by the driver circuit, and a receiving circuit comprising a semiconductor logic circuit, which has a first node and a second node, and is alternately controlled to the precharge period and the evaluation period, according to a second control signal, to precharge the first and second nodes to the first source potential together during the precharge period, and discharge the second node according to a potential at the first node, and discharge the first node according to a potential on the signal line during the evaluation period, thereby making a distinction as to the potential on the signal line, with the potential at the first node as a reference potential. Further, a signal line precharge transistor is provided at an exit portion of the signal line (transmission line).

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description, taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
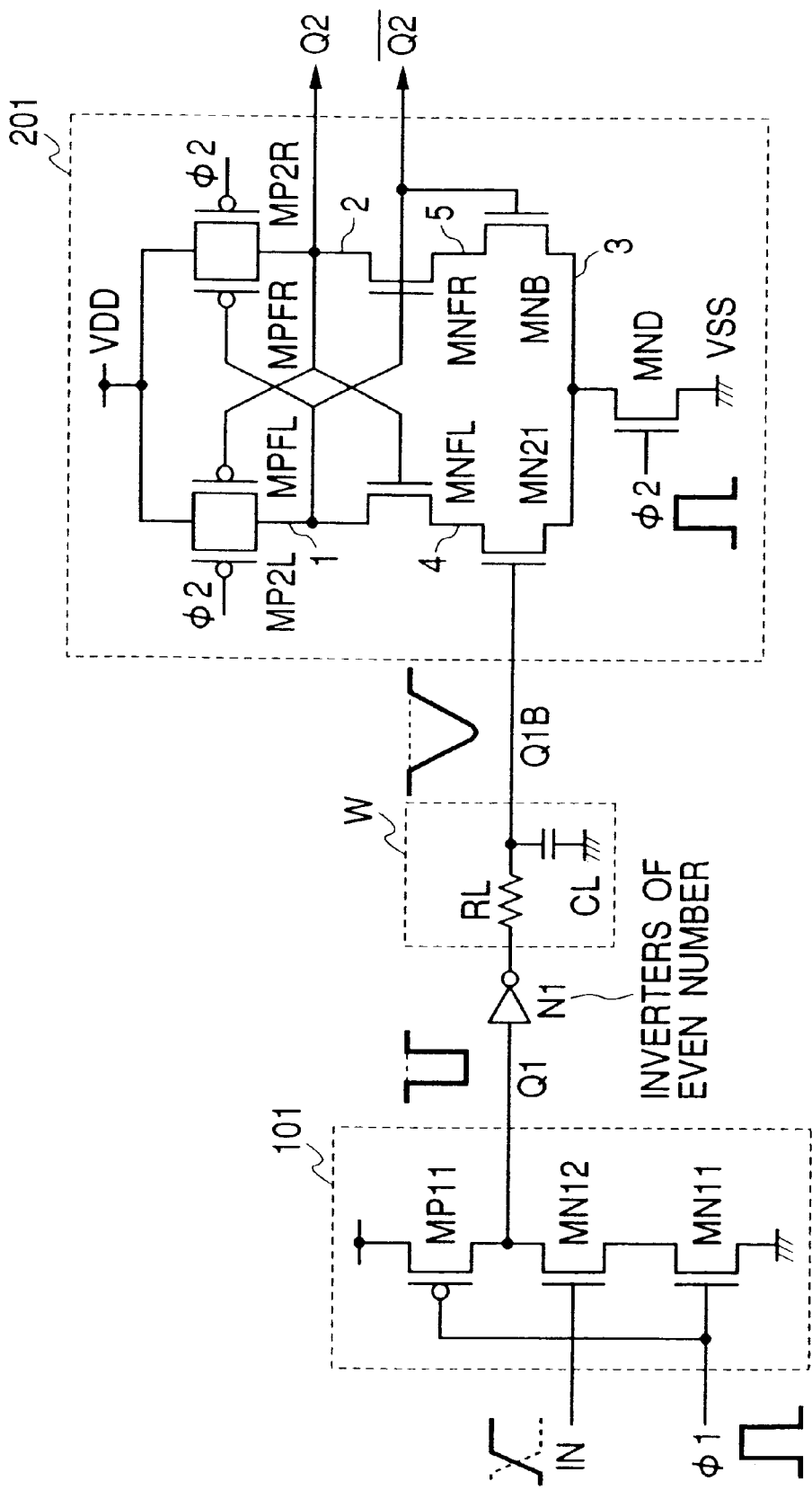
FIG. 1 is a circuit diagram showing a first embodiment.
Figure 18:
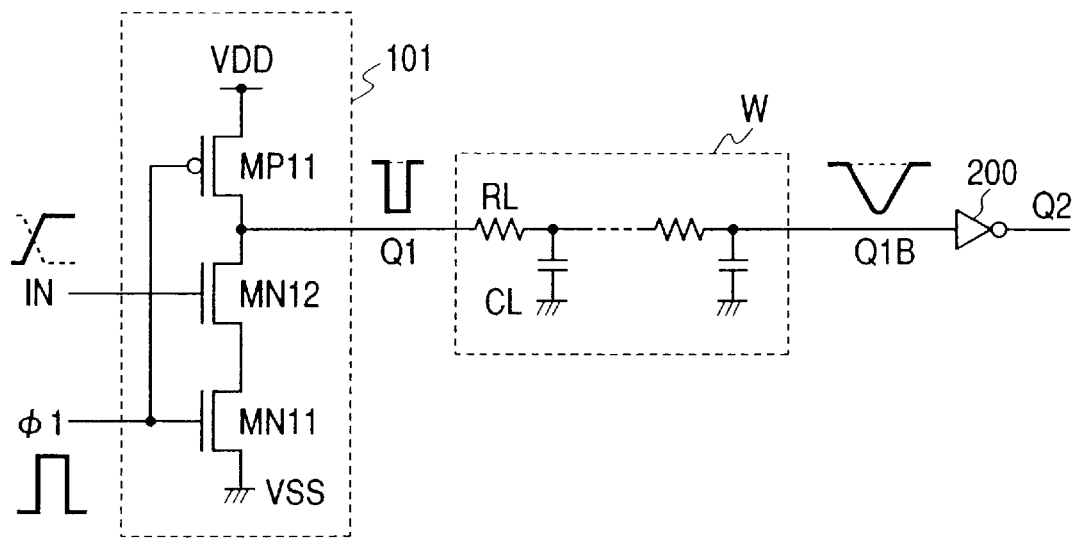
FIG. 18 is a circuit diagram depicting a prior art.
Figure 19:
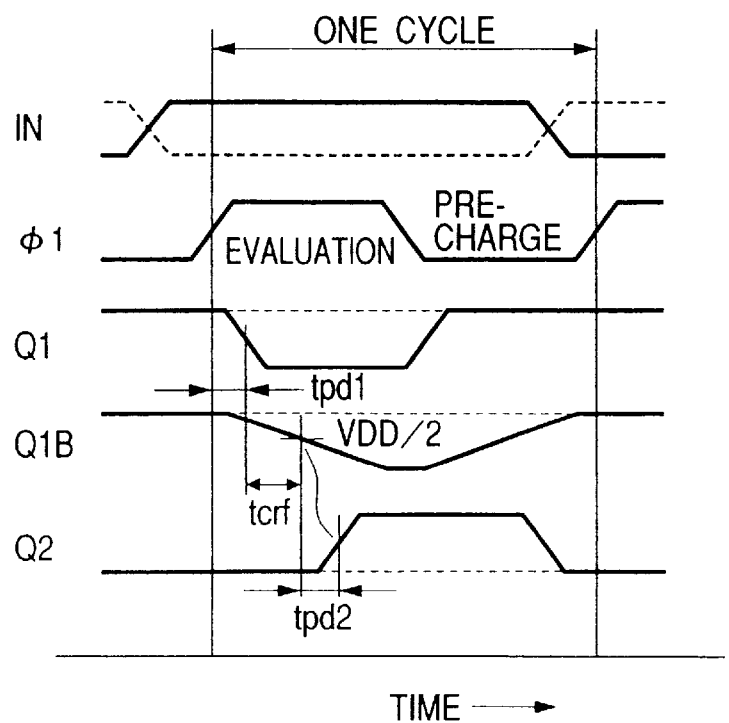
FIG. 19 is a waveform diagram showing the operation of the prior art.

FIG. 1 shows the first embodiment of the present invention. A driver circuit 101 is similar to the driver circuit employed in the prior art shown in FIG. 18. The driver circuit 101 is alternately controlled to a precharge period and an evaluation period based on a control signal $\phi 1$. When the control signal $\phi 1$ falls within a high potential period (precharge period), an MP11 is turned on and an MN11 is turned off so that a signal ok wire W to be driven is precharged to a high potential through the MP11. When the control signal $\phi 1$ is placed during a low potential period (evaluation period), the MP11 is turned off and the MN11 is turned on. Therefore, the state of the output Q1 connected to the signal wire W depends on the state of the input transistor MN12. Namely, if a data signal IN to be transmitted is in a high potential ('H'), then discharging beings to bring the output Q1 to a low potential ('L'). If the data signal IN is 'L', then the output Q1 remains at 'H' under floating. Such a driver circuit 101 drives the signal wire W and transmits data to a receiving circuit 201.

Incidentally, there may be cases where inverters of even numbers are interposed in the course of the signal wire W, as designated at numeral Ni in FIG. 1.

The receiving circuit 201 is a dynamic type logic circuit for, in response to one input signal, obtaining true and complementary outputs approximately equal to each other. This will be referred to below as source-coupled logic (SCL circuit). Details of such SCL circuits have been described in JP-A No. H10-150358, U.S. Pat. No. 5,291,076, and U.S. Pat. No. 5,373,203. Of these, a circuit (latch type SCL circuit) having a latch function is used as the receiving circuit 201, shown in FIG. 1. In the receiving circuit 201, a precharge transistor MP2L is electrically connected between a high potential source VDD and a first node 1, a precharge transistor MP2R is electrically connected between the high potential source VDD and a second node 2, and a control signal $\phi 2$ is connected to the gates of the MP2L and MP2R. The first node 1 is electrically connected to the drain of an input transistor NM21 through a feedback transistor MNFL, whereas the second node 2 is electrically connected to the drain of a reference transistor MNB through a feedback transistor MNFR. The sources of the input transistor MN21 and the reference transistor MNB are connected in common, and an activation transistor MND, controlled based on the control signal $\phi 2$ is electrically connected between a common connecting point (third node) 3 thereof and a low potential source VSS. The signal wire W is electrically connected to the gate of the input transistor MN21. On the other hand, the gate of the reference transistor MNB is electrically connected to the first node 1. The gates of the MNFL and MNFR are, respectively, electrically connected to the second node 2 and the first node 1 in cross form. Further, the gates of a level compensating transistor MPFL, parallel-connected to the MP2L, and a level compensating transistor MPFR, parallel-connected to the MP2R, are also electrically connected to the second node 2 and the first node 1 in cross form, respectively.

When the control signal $\phi 2$ is low in potential (in a precharged state), the precharge transistors MP2L and MP2R are brought into conduction so that the complementary output nodes (Q2 and $\overline{Q2}$) and the gate of the reference transistor MNB are respectively charged to the high potential VDD. Next, if an input Q1B is low in potential when the control signal $\phi 2$ changes from the low potential to the high potential (evaluation state), then the conduction of the MNB, rather than that of the transistor MN21, is strong. Thus, the output node Q2 is discharged to a low potential and the node $\overline{Q2}$ remains at a high potential. On the other hand, if the input Q1B is high in potential, then the conduction of the transistor MN21 and that of the transistor MNB are equal to each other in strength, and ,as a result, the output nodes Q2 and $\overline{Q2}$ both begin to drop in potential. However, when the output node $\overline{Q2}$ starts to drop in potential, the conduction of the MN21 becomes stronger than that of the transistor MNB. Thus, the output node $\overline{Q2}$ is discharged to the low potential, and the output node Q2 is reset to the high potential by the level compensating transistor MPFR. Namely, the present SCL circuit is capable of discriminating whether one input signal is high or low in potential, in response to one input signal and outputting complementary signals approximately equal in delay time to each other.

Figure 2A:
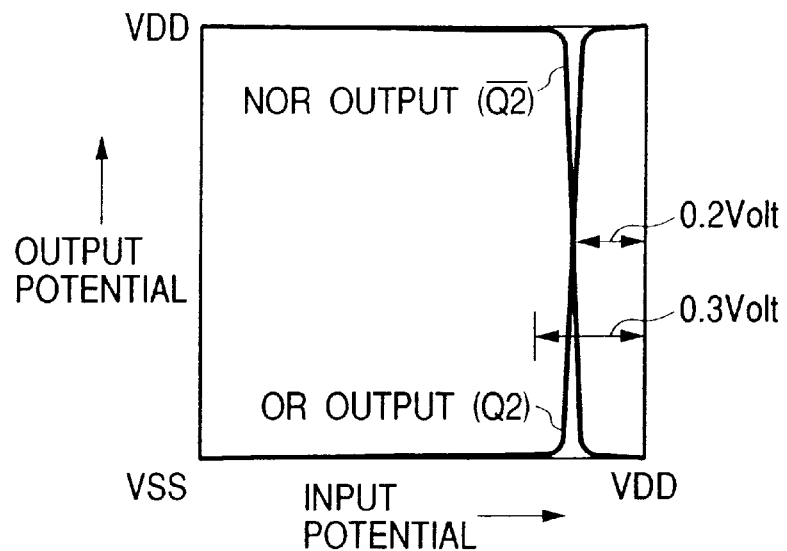
FIGS. 2A and 2B are respectively a characteristic diagram and a waveform diagram illustrating effects obtained in the first embodiment.

An input/output characteristic of the latch type SCL circuit is shown in FIG. 2A. It is understood from the drawing that a logic threshold potential is a potential that is lowered by about 0.2V, as viewed from the high potential VDD. Accordingly, the OR output Q2 is given in the following manner. For example, if the input potential is of the high potential VDD, then the output potential results in the high potential VDD. If the input potential is a potential that is lowered by about 0.3V or higher as seen from the high potential VDD, then the output potential becomes the low potential VSS. The NOR output $\overline{Q2}$ works in reverse. Thus, the reason why the logic threshold potential lies on the high potential VDD side is that since the receiving circuit 201 has the latch function, the degree of amplification is large, and the potential at the gate of the reference transistor MNB is kept at the high potential VDD in its initial stage.

Figure 2B:
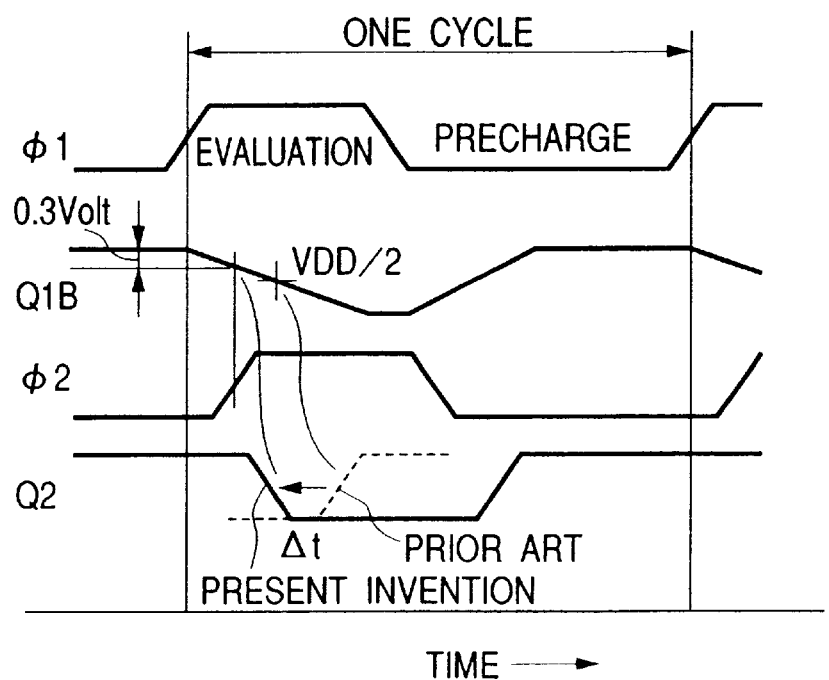

The operation of the first embodiment will next be described using FIG. 1 and FIG. 2B. FIG. 2B is an operation waveform diagram which shows the time that the data signal IN is high in potential. When the control signal $\phi 1$ changes from the low potential to the high potential (evaluation state), a waveform becomes dull at the exit Q1B of the wire W due to the influence of parasitic capacitance and resistance, as described in the prior art. On the other hand, when the control signal $\phi 2$ is low in potential, the receiving circuit 201 is kept in the precharged state, and hence the output Q2 of the receiving circuit 201 is maintained at the high potential, regardless of the potential on the wire W. The timing provided to lower the potential at the exit Q1B of the wire W by about 0.3V, as counted from the high potential, will be enough for the timing provided to input the control signal $\phi 2$, due to the reason mentioned above in FIG. 2A. As a result, the output Q2 changes from the high potential to the low potential in a short time, as indicated by a solid line in FIG. 2B. On the other hand, since the operation of inverting the output is not completed in the prior art when the potential at the exit Q1B of the wire W is not lowered from a potential (VDD/2), a large delay time occurs in the output Q2, as is indicated by a broken line in FIG. 2B. Therefore, the present embodiment, rather than the prior art, is speeded up by a difference ($\Delta$t) in delay time. Incidentally, it is necessary to take into consideration the input timing of the control signal $\phi 2$, with respect to the input timing of the control signal $\phi 1$, in association with a response delay produced by the signal wire W.

Figure 3A:
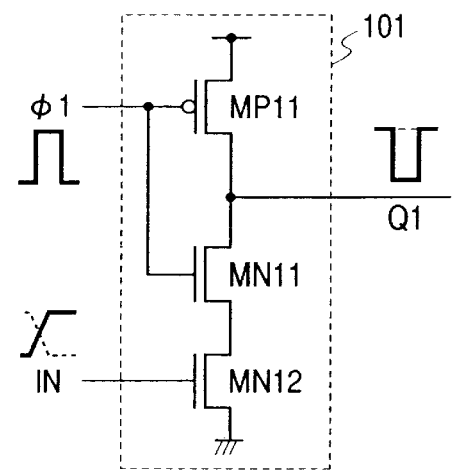
FIGS. 3A through 3D are respectively circuit diagrams depicting modifications of a driver circuit employed in the above-described embodiment.
Figure 3B:
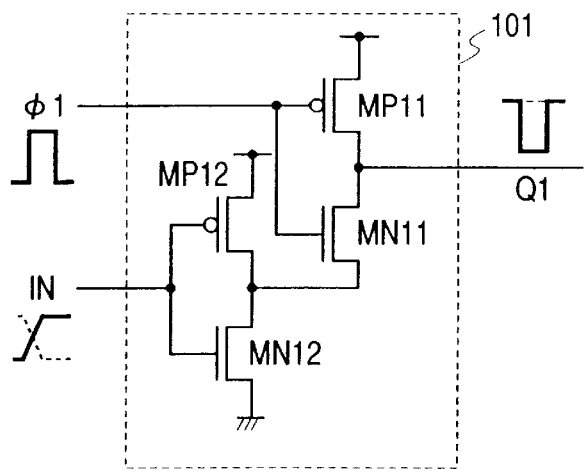
Figure 3C:
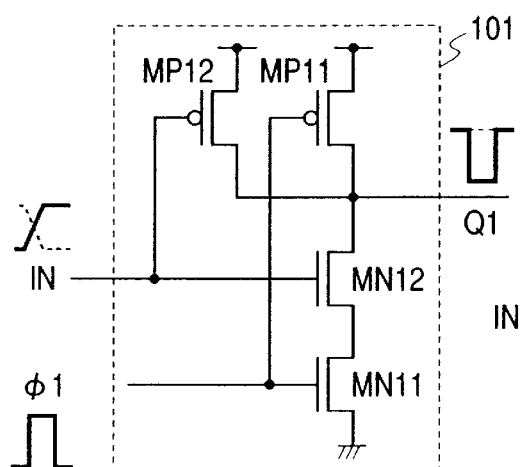

FIGS. 3A through 3D respectively show other driver circuits usable in place of the driver circuit 101 in the transmission circuit shown in FIG. 1. FIG. 3A illustrates a configuration wherein the positions of the transistors MN11 and MN12 of the driver circuit 101 shown in the first embodiment of FIG. 1, are exchanged with one another. FIG. 3B shows a configuration wherein a transistor MP12 is added to FIG. 3A, the gate thereof is electrically coupled to a data signal IN, and the source thereof is electrically connected to the drain of a transistor MN12. FIG. 3C shows a circuit wherein a transistor MP12 is added to the driver circuit 101, shown in FIG. 1. In the present configuration, the gate of the transistor MP12 is coupled to a data signal IN, and the source thereof is electrically connected to an output Q1 in this case. If the control signals $\phi 1$ respectively reach a high potential (evaluation period) when the data signals IN are low in potential, then the outputs Q1 are respectively brought to a floating state during the evaluation period in FIGS. 3A and 3B. However, FIG. 3C shows a configuration capable of preventing the floating state from occurring.

Figure 3D:
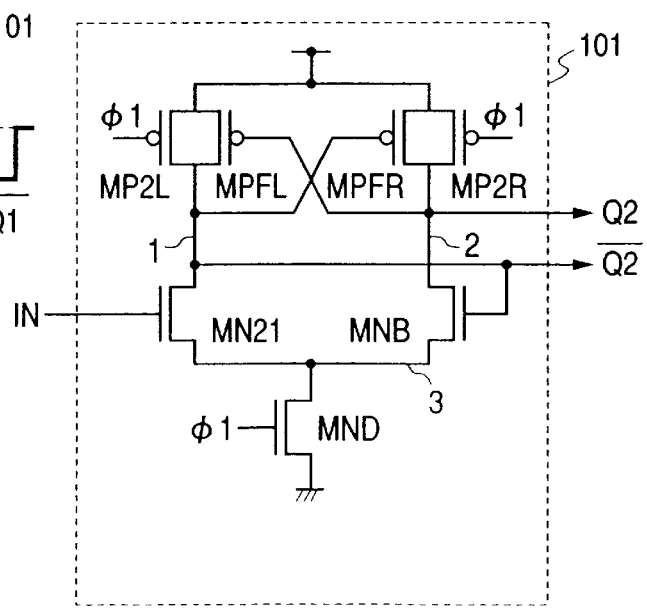

FIG. 3D is an example in which an SCL circuit is used as a driver circuit 101. The circuit shown in FIG. 3D differs from the latch type SCL circuit used as the receiving circuit 201 in the embodiment shown in FIG. 1, in that the feedback transistors MNFL and MNFR are deleted. Since the latch function becomes lost in such a configuration, the circuit can be called a non-latch type SCL circuit. In a manner similar to the driver circuits shown in FIGS. 3A through 3C, these SCL circuits (both the latch and non-latch types) are driven in order to set their output potentials to a high potential during a precharge period, and also driven in order to set their output potentials to output potentials based on an input signal during an evaluation period.

As described above, each of the circuits shown in FIGS. 3A through 3D is a circuit wherein its output signal becomes a signal having a precharge period and an evaluation period. Such a circuit is applicable as a driver circuit in the case of any configuration.

A description will be given next of modifications capable of being used in place of the receiving circuit 201, shown in FIG. 1. Here, of each SCL circuit used as the receiving circuit 201 in FIG. 1, a portion in which an input transistor MN21 and a reference transistor MNB are configured so as to be source-coupled to each other is called a switch unit SW, a portion comprising of the input transistor MN21 in the switch unit SW is called a logic circuit block LB, a portion comprising precharge transistors MP2L and MP2R and level compensating transistors MPFL and MPFR is called a load unit, and a portion comprising an activation transistor MND is called an activation circuit, respectively.

Figure 4A:
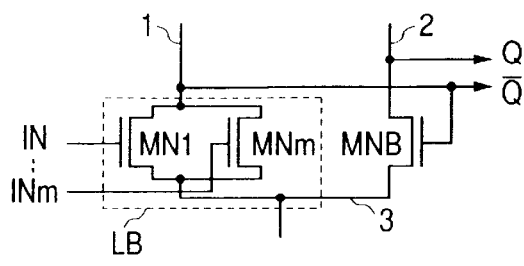
FIGS. 4A through 4H are respectively circuit diagrams showing modifications of a switch unit of a receiving circuit employed in the above-described embodiment.
Figure 4B:
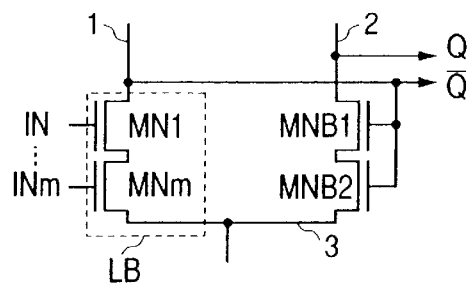
Figure 4C:
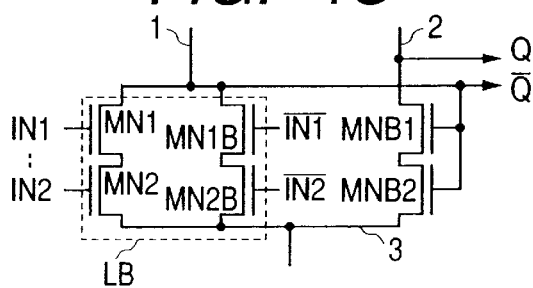
Figure 4D:
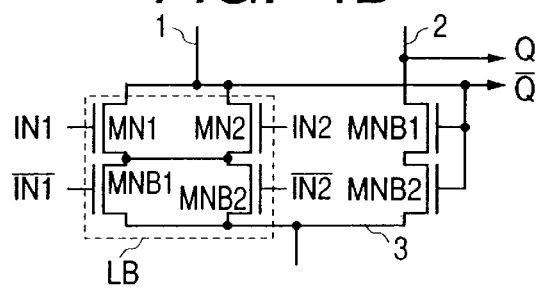
Figure 4E:
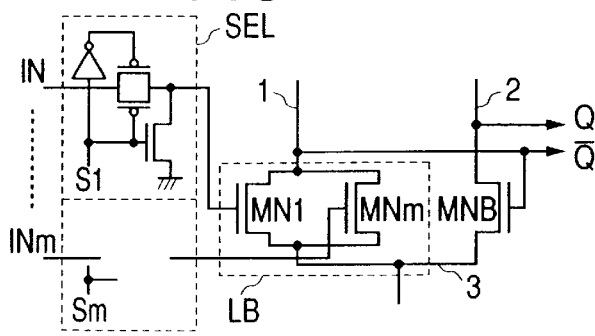
Figure 4F:
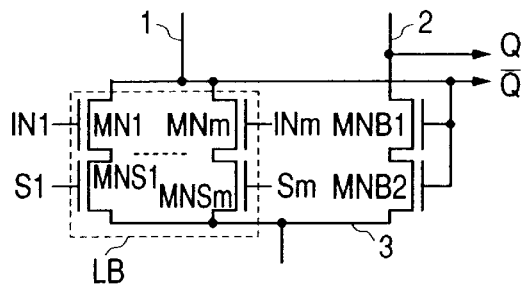

Variations of the switch unit SW in the SCL circuit are illustrated in FIGS. 4A through 4H. In FIG. 4A, a logic circuit block LB comprises a plurality of parallel-connected transistors MN1 through MNm. In this case, the result of OR logic is obtained as an output Q, and the result of NOR logic is obtained as an output $\overline{Q}$. In FIG. 4B, a logic circuit block LB comprises a plurality of tandem connected transistors MN1 through MNm. In this case, reference transistors are also tandem-connected, as designated at MNB1 and MNB2. The result of AND logic is obtained as an output Q, and the result of NAND logic is obtained as an output $\overline{Q}$. In FIG. 4C, a logic circuit block LB comprises a pair of two tandem-connected transistors MN1 and MN2, which receive inputs IN1 and IN2 respectively, and a pair of two tandem-connected transistors MNB1 and MNB2, which receive their complementary inputs /IN1 and /IN2 therein, both of which are connected in parallel. In this case, the result of XOR logic is obtained as an output Q, and the result of its inverse logic is obtained as an output $\overline{Q}$. In FIG. 4D, a logic circuit block LB comprises a pair of parallel-connected transistors MN1 and MN2, supplied with inputs IN1 and IN2 respectively, and a pair of parallel-connected transistors MNB1 and MNB2, supplied with their complementary inputs /IN1 and /IN2, both pairs of which are connected in series. The circuit shown in FIG. 4D obtains the same result of logic as that obtained in the circuit shown in FIG. 4C. FIG. 4E shows a configuration wherein an input to a logic circuit block LB is inputted via a selector SEL. Whether or not any signal should be transmitted to the logic circuit block LB, is control led based on select signals S1 through Sm. While FIG. 4F is similar in configuration to FIG. 4C, FIG. 4F is identical in function to FIG. 4E, because select signals S1 through Sm are used as signals to be inputted to transistors MNS1 through MNSm. When, for example, the input field effect transistor MN1 and the reference field effect transistor MNB are not configured in tandem, as in the case of FIG. 4A, the respective transistors can be replaced by bipolar transistors. Since, in this case, the bipolar transistors rather than the field effect transistors, are high or excellent in current switch performance, they are large in amplification degree. As a load unit in this case, a load having a configuration shown in FIG. 6D, which will be described later, is used so as not to saturate the bipolar transistors.

Figure 4G:
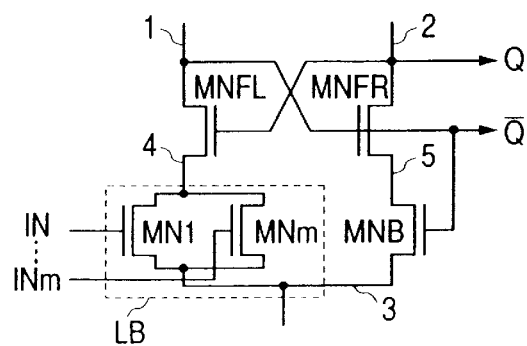
Figure 4H:
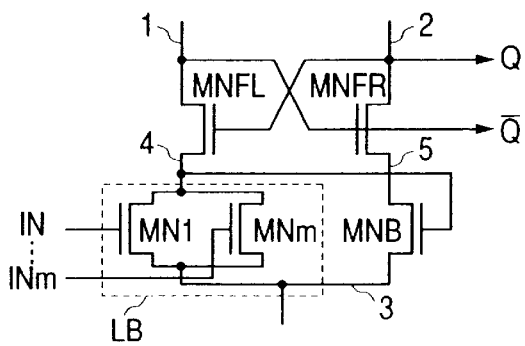
Figure 5:
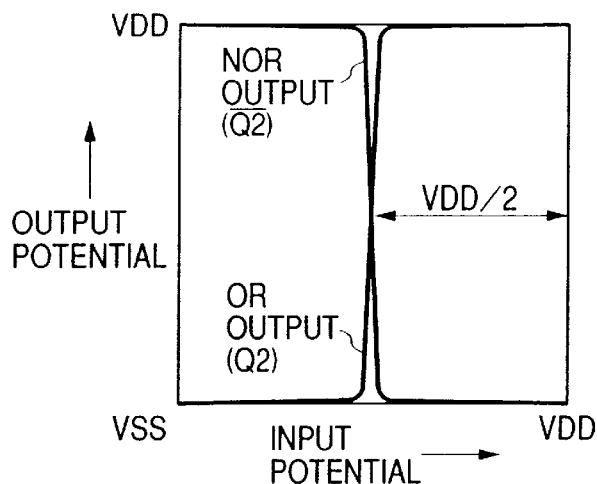
FIG. 5 is a diagram illustrating the input/output characteristic of an SLC circuit described in each of FIGS. 4A through 4F.

Since the receiving circuit, which has adopted each of the switch units shown in FIGS. 4A through 4F, described up to now, has no feedback transistors, it serves as a non-latch type SCL circuit. The non-latch type SCL circuit is small in amplification degree and low in logic threshold potential, as compared with the latch type SCL circuit shown in FIG. 5. Thus, a change in input potential larger than that of the latch type SCL circuit is required to make the discrimination as to an input potential between a low potential and a high potential. Therefore, a margin greater than that of the latch type SCL circuit is required as a timing margin for both the input signal Q1B and control signal φ 2. Accordingly, the latch type SCL circuit has the advantage of shortening the delay time. Two feedback transistors, whose gates and drains are cross-connected, may be added to configure the latch type SCL circuit, and are applicable to any of the circuits shown in FIGS. 4A through 4F. Examples each corresponding to FIG. 4A, are shown in FIGS. 4G and 4H. In a switch unit shown in FIG. 4G, the gate of a reference transistor MNB is electrically connected to a node 1 (output $\overline{Q}$) in a manner similar to the receiving circuit 201 employed in the first embodiment shown in FIG. 1. In a switch unit shown in FIG. 4H, the gate of a reference transistor MNB is electrically connected to a node 4 corresponding to one terminal of a logic circuit block LB. Since the potential applied to the gate of a reference transistor MNB at the precharge stage becomes a potential lowered by a threshold voltage, as compared with a high potential VDD in FIG. 4H, the logic threshold potential is also reduced. Accordingly, the circuit shown in FIG. 4G is advantageous in terms of increased operating speed.

Figure 6A:
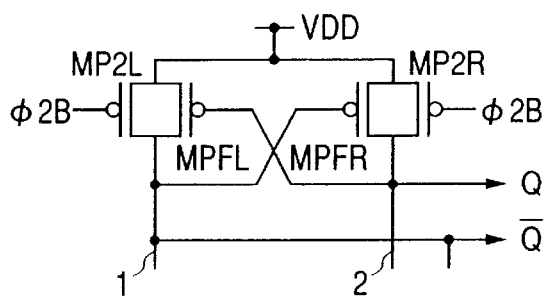
FIGS. 6A through 6D are respectively circuit diagrams depicting modifications of a load unit of the receiving circuit employed in the above-described embodiment.
Figure 6B:
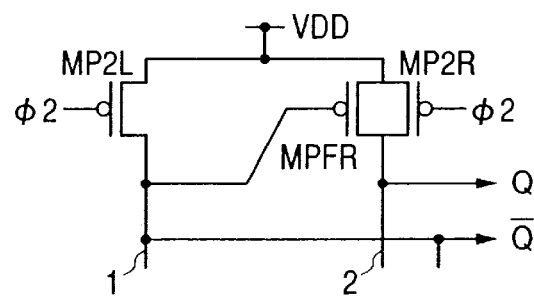
Figure 6C:
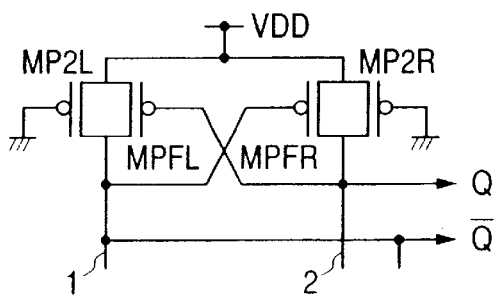
Figure 6D:
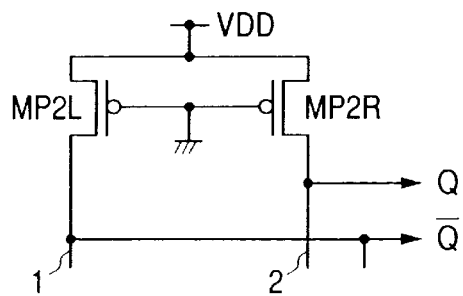

FIGS. 6A through 6D respectively show variations of a load unit of an SCL circuit that is adoptable as a receiving circuit. In FIG. 6A, the gates of precharge transistors MP2L and MP2R are driven based on a control signal φ 2B, different from the control signal φ 2 for the activation circuit. As a result of the driving of the control signal φ 2B with faster timing than that of the control signal φ 2, the SCL circuit operation can be sped up in a manner similar to the commonly available domino circuit, as compared with the driving of the two with the same timing. FIG. 6B shows a configuration in which the level compensating MPFL is deleted. Although a drawback arises in that an output node $\overline{Q}$ is brought to a floating state during an evaluation period in this case, the effect of reducing the area is obtained. In FIG. 6C, the gates of precharge transistors MP2L and MP2R are always driven based on a low potential VSS. In this case, the signal amplitude of each of outputs (Q and $\overline{Q}$) can be set to an arbitrary amplitude without being set to a full amplitude. When the amplitude thereof is small, level compensating transistors MPFL and MPFR become unnecessary in a manner similar to FIG. 6D, and hence an area reducing effect is obtained.

Figure 7A:
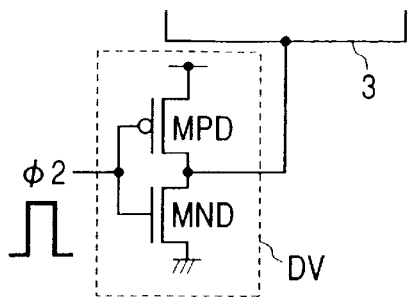
FIGS. 7A through 7C are respectively circuit diagrams showing modifications of an activation circuit of the receiving circuit employed in the above-described embodiment.
Figure 7B:
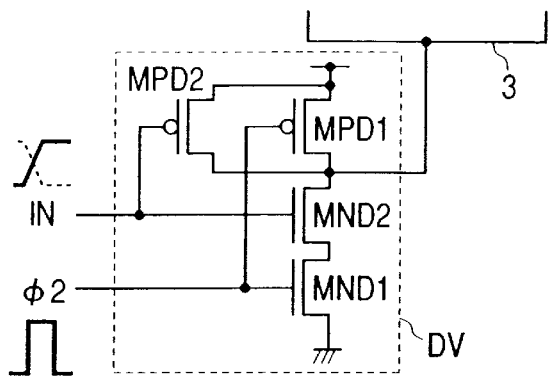
Figure 7C:
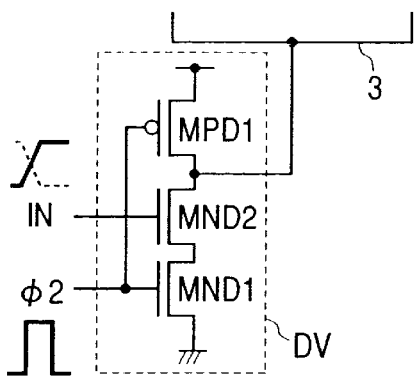

FIGS. 7A through 7C respectively show variations of an activation circuit of an SCL circuit applicable as a receiving circuit. In FIG. 7A, an activation circuit DV comprises an inverter comprised of transistors MPD and MND. The input of the inverter is coupled to a control signal φ 2, and the output thereof is electrically connected to a node 3 of a source-coupled unit of an SCL circuit. When the transistor MPD is not provided, the node 3 is precharged by a reference transistor MNB. On the other hand, when the transistor MPD exists, the node 3 is precharged by both transistors MPD and MNB. Therefore, the time required to precharge the node 3 and an output node Q is shortened. In FIG. 7B, an activation circuit DV comprises a plural-input NAND circuit (two-input type in the drawing, by way of example). In such a configuration, even when a control signal φ 2 is brought to an activated state (high potential), a SCL circuit is activated only when all the inputs of the NAND circuit are high in potential, and is not activated except for that, whereby power consumption is reduced.

FIG. 7C is a modification of FIG. 7B, and shows a configuration in which a transistor MPD2 is deleted. When a data signal IN is low in potential and a control signal φ 2 is brought to an activated state (high potential), a node 3 is brought to a floating state. However, the transistor MPD2 is neither necessary nor essential to the configuration.

Figure 9:
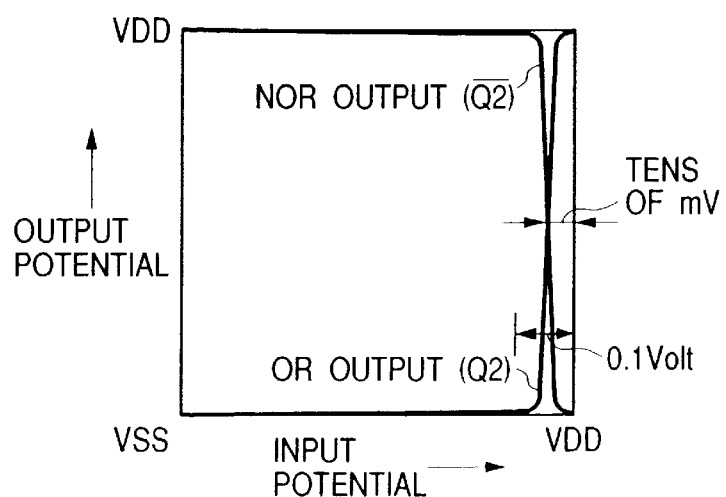
FIG. 9 is a diagram depicting the input/output characteristic of the receiving circuit employed in the above-described embodiment.
Figure 8:
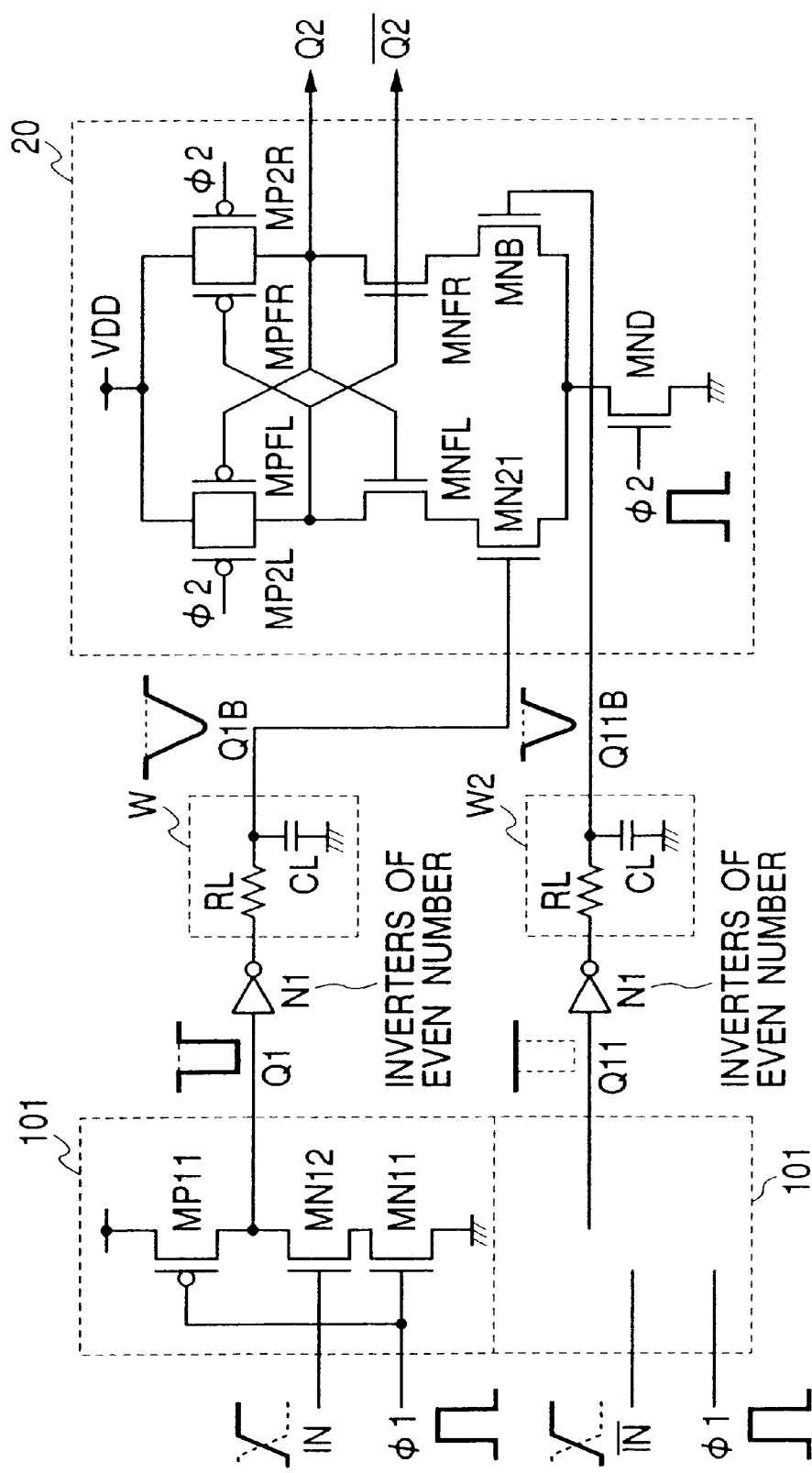
FIG. 8 is a circuit diagram illustrating a second embodiment.

An example in which input signal lines are a complementary signal pair is next shown in FIG. 8 as the second embodiment. As compared with the first embodiment, shown in FIG. 1, the embodiment shown in FIG. 8 is provided with another driver circuit 101', identical in configuration to the driver circuit 101. They differ from each other in that the driver circuits are activated complementarily. Namely, an input signal IN of the driver circuit 101 has a complementary bearing on an input signal /IN of the driver circuit 101'. Thus, a signal wire W driven by the driver circuit 101 and a complementary signal wire W2 driven by the driver circuit 101' are respectively charged to a high potential VDD during a precharge period. During an evaluation period, one of them is discharged to a low potential VSS, whereas the other remains at VDD. The receiving circuit 202 is substantially similar in internal configuration to the receiving circuit 201 employed in the embodiment shown in FIG. 1 but different therefrom in that a reference transistor MNB is electrically connected to the complementary signal wire W2 without being connected to anode $\overline{Q2}$. Since a logic threshold potential is a potential that is lowered by several tens of mV from the high potential in the present receiving circuit 201, as represented by an input/output characteristic shown in FIG. 9, the receiving circuit 202 discriminates between the low potential and the high potential if the difference in potential between the wire W and the wire W2, corresponding to the complementary signal line pair, is 0.1 V or higher. Thus, since timing margins for each input signal and the control signal φ 2 can be shortened, as compared with the receiving circuit 201 employed in the first embodiment shown in FIG. 1, a further speed-up is achieved. However, this is implemented in compensation for inconveniences such as the fact that the driver circuits and the signal wires increase twice.

Figure 10:
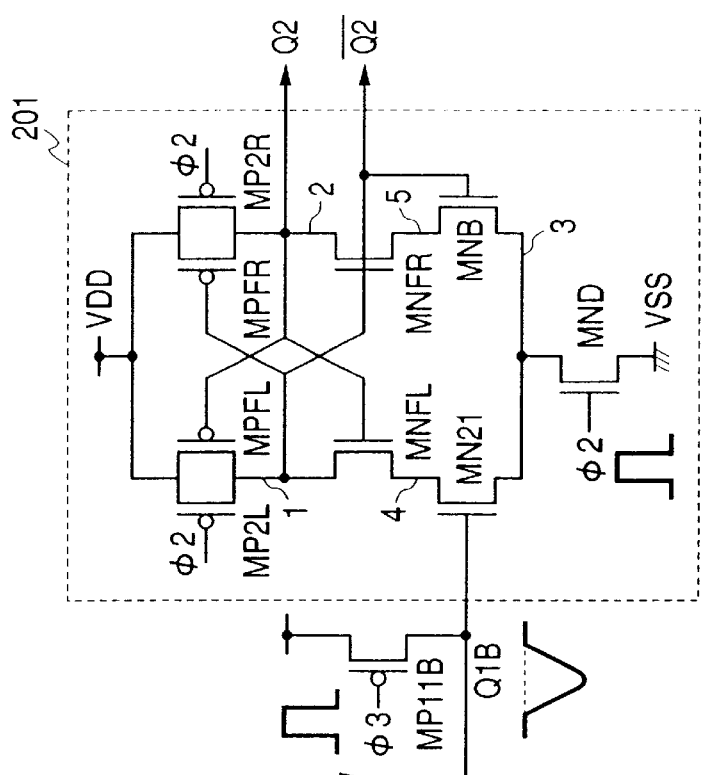
FIG. 10 is a circuit diagram showing a modification illustrative of the receiving circuit and a driver circuit both employed in the above-described embodiment.
Figure 10:
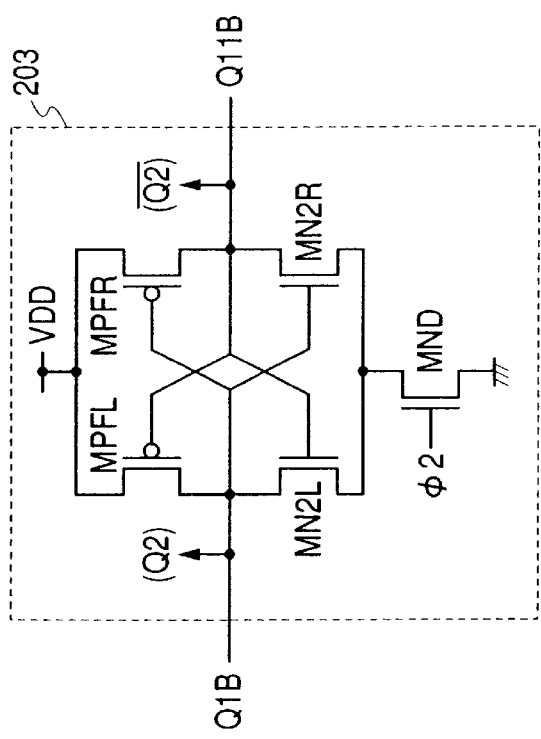

FIG. 10 shows another receiving circuit employed in the second embodiment. The receiving circuit 201, shown in the present drawing, is of a commonly-used latch type sense amplifier, and has an input/output characteristic similar to that of the receiving circuit employed in the second embodiment. Thus, since timing margins for input signals Q1B and Q1B and a control signal φ 2 can be shortened in a manner similar to the receiving circuit employed in the second embodiment, the speeding up of the receiving circuit is achieved. Since, however, an input node also serves as an output node in the present embodiment, an input signal line is driven at full amplitude. Therefore, power consumption is large, as compared with the second embodiment shown in FIG. 8. Incidentally, a latch circuit that is identical in configuration to the receiving circuit 202 shown in FIG. 8, or to the receiving circuit 203 shown in FIG. 10, may be used even in the driver circuits 101 and 1011 shown in FIG. 8.

Figure 11:
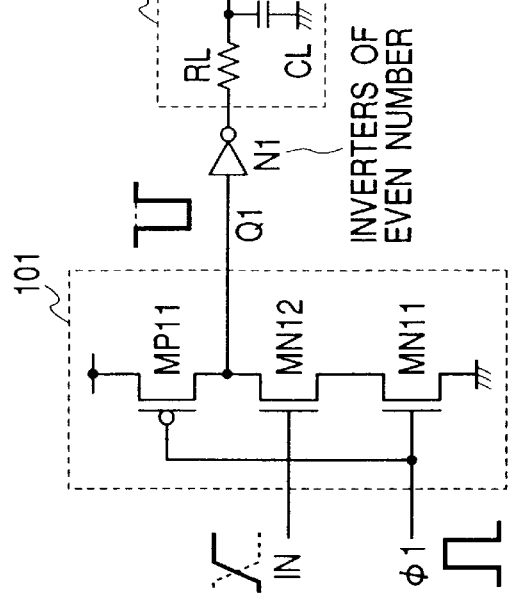
FIG. 11 is a circuit diagram illustrating a third embodiment.

Next, an embodiment for achieving further shortening of a transmission cycle time is illustrated in FIG. 11. The present embodiment is different from the embodiment shown in FIG. 1 in that a signal line precharge transistor MP11B is additionally provided on the input side of a receiving circuit 201. A problem which arises when the signal line precharge transistor MP11B is not provided, will first be explained using an the operational waveform shown in FIG. 12. When a control signal φ 1 of a driver circuit 101 changes from 'H' to 'L', and thereby a precharge operation is started by a transistor MP11 of the driver circuit, a long time interval is required until the completion of a precharge operation at an exit Q1B of a wire W due to the influence of wiring resistance and capacitance, as indicated by a dashed line at Q1B in FIG. 12.

Figure 12:
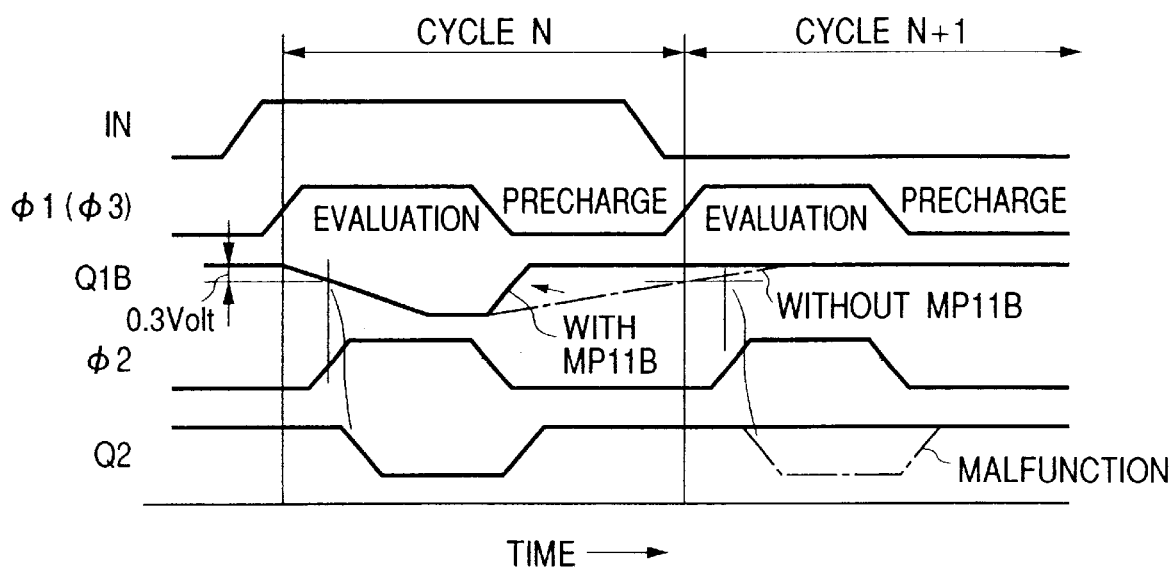
FIG. 12 is a diagram depicting operation waveforms and effects obtained in the third embodiment.

In the case of the waveform indicated by the dashed line, even if a control signal φ2 is switched from 'L' to 'H' in the next cycle and the receiving circuit 201 reaches its activated timing, the precharge operation at Q1B is not completed and the receiving circuit 201 reaches a malfunction operation in which data error is outputted. It is necessary that avoidance of the malfunction operation lengthens a cycle time up to the time for the completion of the precharge operation at Q1B. In other words, the cycle time is rate-controlled by the time taken for the completion of the precharge operation at Q1B. In order to make countermeasures against it, the signal line precharge transistor MP11B is additionally provided in the embodiment shown in FIG. 11. The drain of the transistor MP11B is electrically connected to the exit Q1B of the wire W, and a control signal φ3 is inputted into the gate of the transistor MP11B. Timing provided to input the control signal φ3 is important in the present invention. Namely, if the timing provided to raise the control signal φ3 is delayed with respect to the control signal φ1, where a data signal IN is 'H' and the control signal φ1 rises so as to change from a precharge state to an evaluation state, then transistors MN11, MN12, and MP11B are brought into conduction during its delayed period so that a through current flows therethrough. No particular problem arises in the case of inverse timing. On the other hand, if the timing provided to generate the control signal φ3 is faster than that for the control signal φ1, where the control signal φ1 falls, then the transistors MN11, MN12, and MP11B are brought into conduction during a period corresponding to the difference in timing therebetween, so that a through current flows therethrough. When the falling timing of the control signal φ3 is delayed with respect to the falling timing of the control signal φ1 in reverse, then the precharge operation at the exit Q1B of the wire W by the transistor MP11B is delayed correspondingly. It is necessary for the best conditions to exit in order to avoid to occurance of these problem for example, the rising and falling timings for the control signal φ3 are synchronized with the control signal φ1. FIG. 12 shows the best conditions established for φ1 and φ3. According to the present embodiment, in this case, the precharge operation at the exit Q1B of the wire W is carried out substantially without being under the influence of parasitic capacitance and resistance of the wire W. Accordingly, the waveform at the exit Q1B of the wire W rises at a high speed as indicated by a sold line as compared with the prior circuit. It is therefore possible to shorten the cycle time.

Figure 13:
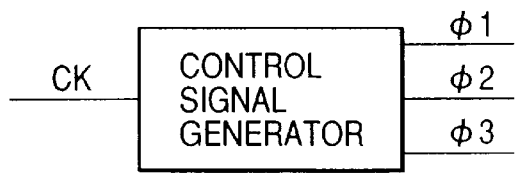
FIG. 13 is a conceptional diagram showing a control signal generating method.
Figure 14:
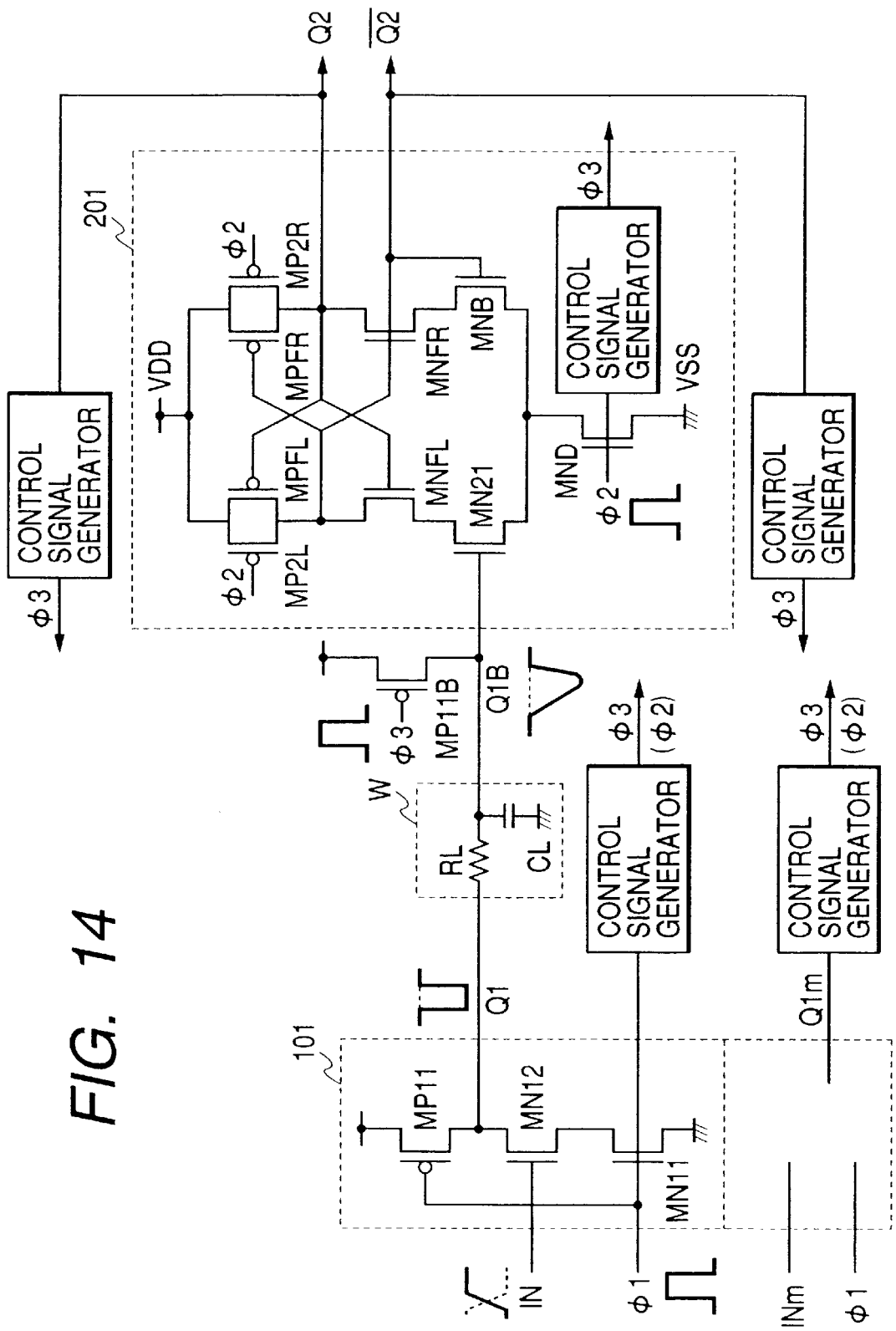
FIG. 14 is a conceptional diagram illustrating another control signal generating method.

A control signal generating method will next be described. FIG. 13 shows a method of generating control signals φ1, φ2, and φ3, based on an external clock CK. The control signals φ1, φ2 and φ3 are generated as outputs produced from a control signal generator with the external clock CK as an input. The control signals φ1, φ2 and φ3 are supplied to the driver circuit, receiving circuit, and signal line precharge transistor. FIG. 14 shows another example of the control signal generating method. For example, the control signal φ2, or φ3 is generated based on the control signal φ1 of the driver circuit 101. Alternatively, the control signal φ2 or φ3 is generated based on an output signal Q1 (or Q1m) of the driver circuit 101. As an alternative to the above, the control signal φ3 can be generated based on the control signal φ2 or output signals Q2 and $\overline{Q2}$ of the receiving circuit 201.

Figure 15:
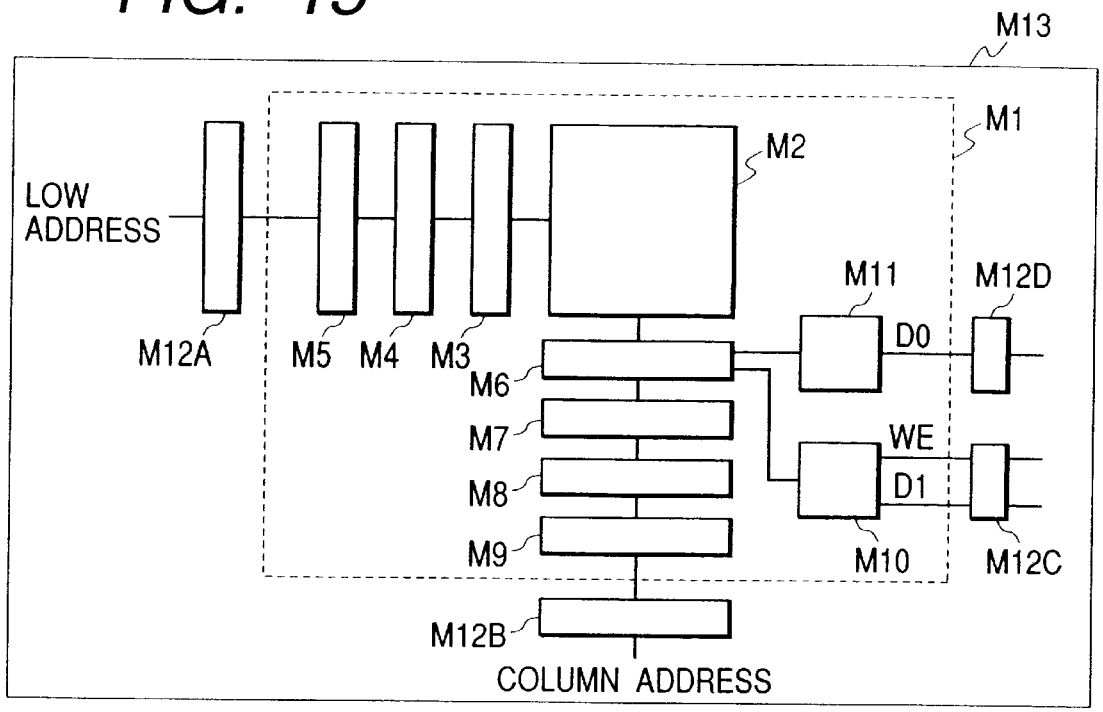
FIG. 15 is a block diagram depicting a fourth embodiment.

A description will now be given of an example in which the present transmission circuit is applied to a semiconductor integrated circuit and a semiconductor memory. An entire block diagram of the semiconductor integrated circuit is shown in FIG. 15 as the fourth embodiment. A semiconductor integrated circuit M13 has a semiconductor memory macro M1, i.e., a memory cell array M2, a row decoder and word driver M3, a row predecoder M4, a row address buffer M5, a read-write circuit M6, a column decoder and driver M7, a column predecoder M8, a column address buffer M9, a read-write control circuit M10, an output circuit M11, and driver circuits 12A through 12D for transmitting signals to and receiving the same from, the respective input/output circuits of the semiconductor memory macro M1. The memory cell array M2 has a number of memory cells in which memory cell select terminals are electrically connected to their corresponding word lines, and memory cell output terminals are electrically connected to their corresponding bit lines. These memory cells are placed in matrix form. The row address buffer M5 converts a row address signal to an internal complementary address signal, and the row predecoder M4 decodes the converted signal. Further, the row decoder and word driver M3 decodes it and drives a word line, selected based on the result of decoding to a selection level. The column address buffer M9 converts a column address signal to an internal complementary address signal and the column predecoder M8 decodes the converted signal. Further, the column decoder and driver M7 decodes the result of the decoding. The corresponding bit line is selected according to the result of the decoding by the column decoder and driver M7. A memory cell specified by the row address signal and the column address signal is selected in this way.

Here, the driver circuits M12 through M12C for transmitting the signals to their corresponding input circuits of the semiconductor memory macro Ml correspond to the driver circuit 101. An output line thereof corresponds to the signal wire W, or the signal wire W and complementary signal wire W2. The row address buffer M5, the column address buffer M9, and the read-write control circuit M10 comprise the receiving circuit 201. Further, the output circuit M11 corresponds to the driver circuit 101, and an output line thereof corresponds to the signal wire W, or the signal wire W and complementary signal wire W2. As a result of the constitution of the driver circuit M12D by the receiving circuit 201, the time necessary for the driver circuit M12D to transmit a data signal to the semiconductor memory macro M1 is shortened, owing to the above speeding-up effect.

Figure 16:
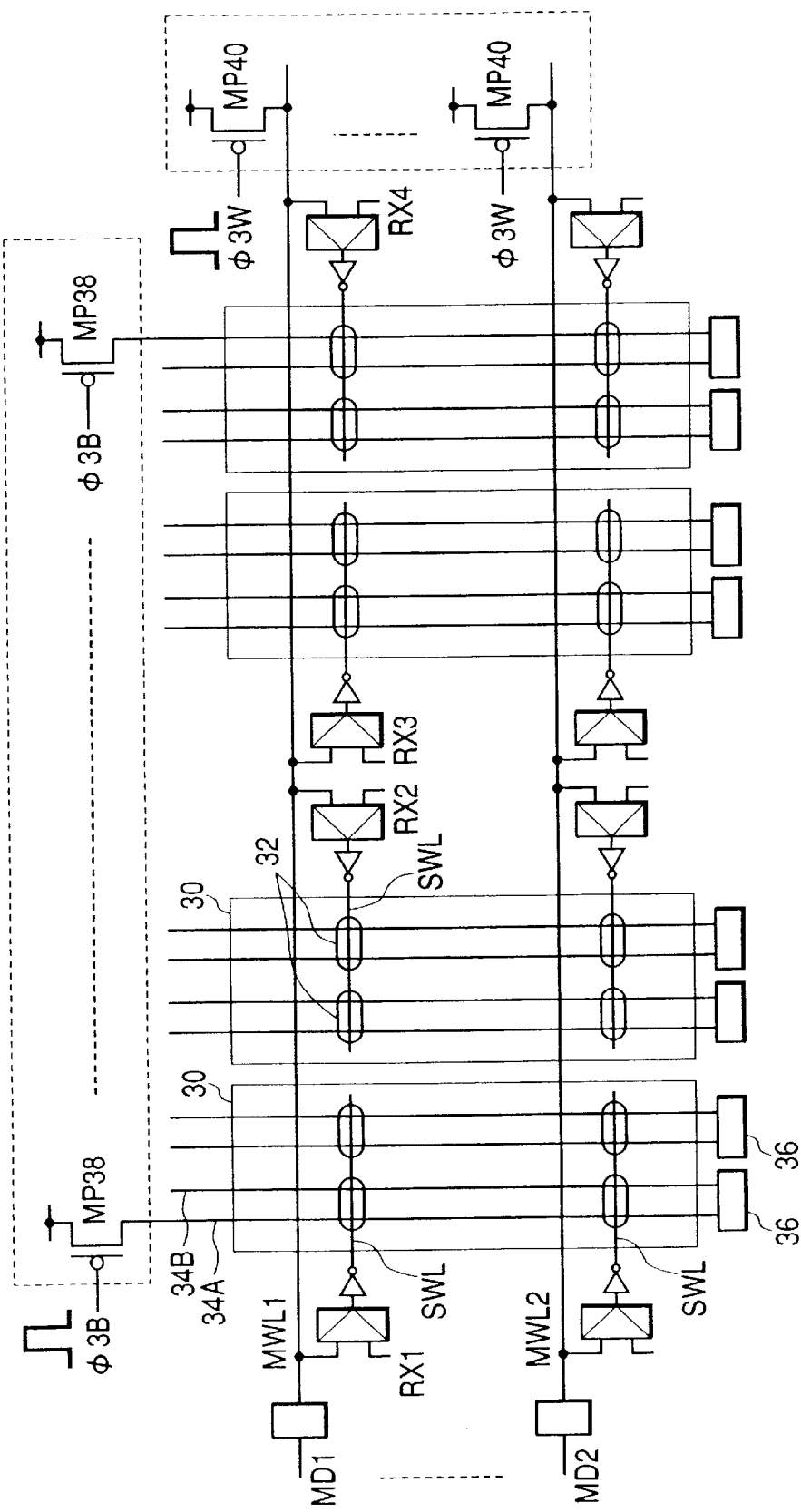
FIG. 16 is a circuit diagram showing a fifth embodiment.

The memory cell array and peripheral circuits of the semiconductor memory macro M1 (or semiconductor memory) are shown in FIG. 16 as the fifth embodiment. The memory cell array in which a number of memory cells 32 are two-dimensionally arranged, is divided into a plurality of sub memory arrays 30. A plurality of sub word drivers RX1, RX2, RX3, and RX4 are electrically connected to main word lines typified by MWL1 and MWL2, respectively. Sub word lines SWL respectively corresponding to the sub memory arrays, are electrically connected to their corresponding sub word drivers. Read-write control circuits 36 are electrically connected to their corresponding bit line pairs, each typified by 34A and 34B. Precharge transistors MP38 are electrically connected to their corresponding ends of the bit lines.

The main word lines MWL1 and MWL2 are respectively driven by word drivers MD1 and MD2. The driver circuit 101 shown in FIG. 1, or those shown in FIGS. 3A through 3D, are adopted as the main word drivers MD1 and MD2. At this time, a signal to be inputted to the driver circuit corresponds to an output produced from a row decoder for selecting each row of the memory cell array. Each of the main word lines MWL1 and MWL2 corresponds to the signal wire W shown in FIG. 1. Precharge transistors MP40, each similar to the MP11B shown in FIG. 11, are electrically connected to the far-off ends of these main word lines respectively, as viewed from the word drivers. The receiving circuit 201, shown in FIG. 1, or the receiving circuits taking the diverse variations shown in FIGS. 3A through 3D, FIGS. 4A through 4D, and FIGS. 6A through 6C, are adopted as the sub word drivers RX1 through RX4. Namely, each of the main word drivers is alternately controlled to a precharge period and an evaluation period, according to a first control signal. During the precharge period, the main word driver precharges each main word line to a high potential VDD and drives it to either the high potential VDD or a low potential VSS, according to the output of the row decoder. Each of the sub word drivers has a first node and a second node to which the corresponding one of the subwordlines is connected. The sub word driver is alternately controlled to the precharge period and the evaluation period, according to a second control signal. During the precharge period, the sub word driver precharges both the first and second nodes to a first source potential. During the evaluation period, the sub word driver discharges the second node according to the potential at the first node, and discharges the first node according to the potential at each main word line. Thus, the potential at one main word line is discriminated from the potentials of other word lines, with the potential at the first node serving as a reference potential so that the corresponding connected sub word line is driven. As a result of such a configuration, the time required to drive each main word line can be shortened.

Figure 17:
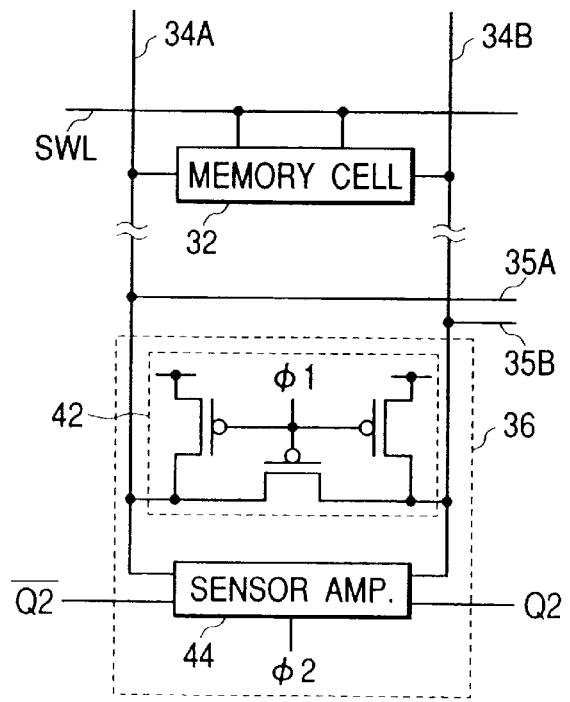
FIG. 17 is a diagram illustrating a read/write control circuit employed in the fifth embodiment.

Further, the receiving circuit shown in FIG. 8 or the like is used for the read-write control circuit 36, to make it possible to shorten the time required to drive each bit line. This will be explained with reference to FIG. 17. FIG. 17 shows one example of the read-write control circuit 36 as it is applied to the fifth embodiment and its periphery. Only one typical memory cell is illustrated as electrically connected to a bit line pair 34A and 34B. Reference numerals 35A and 35B are respectively common data lines used for data writing. The read-write control circuit 36 comprises a pull-up circuit 42 and a sense amplifier 44. The receiving circuit 202 shown in FIG. 8, or the receiving circuit 203 shown in FIG. 10 can be adopted as the sense amplifier 44. Thus, a portion comprising the memory cell 32 and the pull-up circuit 42 corresponds to the driver circuit 101 of the transmission circuit shown in FIG. 8. Further, the bit lines 34A and 34B correspond to the signal wire W and the signal wire W2, respectively. The pull-up circuit 42 is driven by a control signal $\phi$ 1 that is substantially in synchronism with a signal on a sub word line. Namely, when the sub word line is low in potential, the control signal $\phi$ 1 is also low in potential. Thus, the bit line pair 34A and 34B is precharged to a high potential by transistors of the pull-up circuit. On the other hand, when the selected sub word line SWL reaches a high potential, the control signal $\phi$ 1 is also high in potential, and, hence, the pull-up circuit reaches an evaluation state. If the corresponding memory cell is in an information read state, for example at this time, then the difference in potential, which is developed between the bit line pair 34A and 34B, is amplified by the sense amplifier 44 or 201, as described above, and output signals Q2 and $\overline{Q2}$ are supplied to the next-stage circuit.

Figure 20:
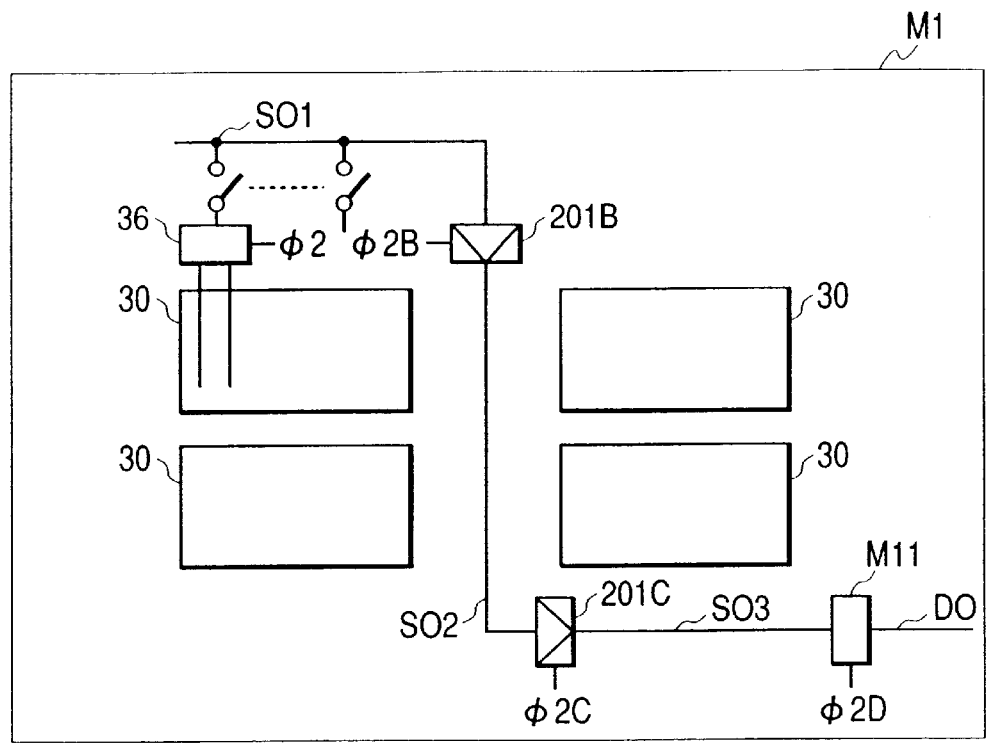
FIG. 20 is a block diagram illustrating a sixth embodiment.

FIG. 20 shows the sixth embodiment. The present embodiment illustrates an example in which an output produced from the read-write control circuit 36, employed in the fifth embodiment, is transmitted to an output circuit M11. Namely, an output SO1 produced from the read-write control circuit 36 is received by a receiving circuit 201B which is driven by a control signal $\phi$ 2B. An output SO2 is produced from the receiving circuit 201C which is driven by a control signal $\phi$ 2C. Further, an output SO3 produced from the receiving circuit 201C is received by the output circuit M11 which is driven by a control signal $\phi$ 2D. The above SO1 through SO3 respectively correspond to the signal lines of the transmission circuits shown in FIG. 1 and the like. The receiving circuits 201B, 201C, and output circuit M11 respectively correspond to the receiving circuit in the transmission circuit. As a result of the present embodiment, the access time for a semiconductor memory macro (or semiconductor memory) is shortened, as described above.

Figure 21:
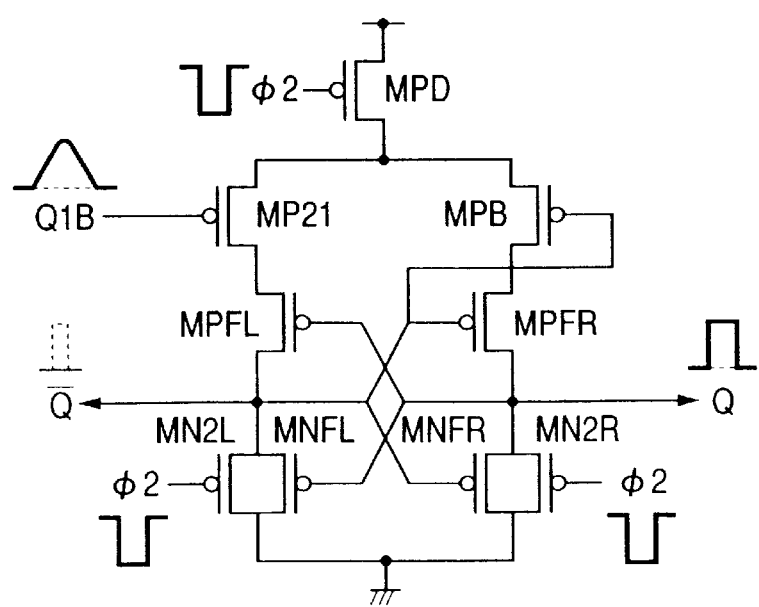
FIG. 21 is a circuit diagram depicting another driver circuit and another receiving circuit employed in the present embodiment.

FIG. 21 shows another receiving circuit employed in the present embodiment. The present embodiment takes the form wherein the receiving circuit 201, employed in the first embodiment shown in FIG. 1, is turned upside down and the respective signals are made opposite in polarity. While the signals are different in polarity from one another, the present receiving circuit can obtain an effect similar to the receiving circuit 201 employed in the first embodiment, even in the case of such a configuration. Namely, a modification of the above embodiment, wherein an n type device is replaced by a p type device, and a p type device is replaced by an n type device, falls within a scope capable of being inferred and considered by those skilled in the art. Since the polarities of the output signals and the inverted input signal are changed, the addition of another inverter to an output point also falls within an easy-to-infer scope.

Figure 22:
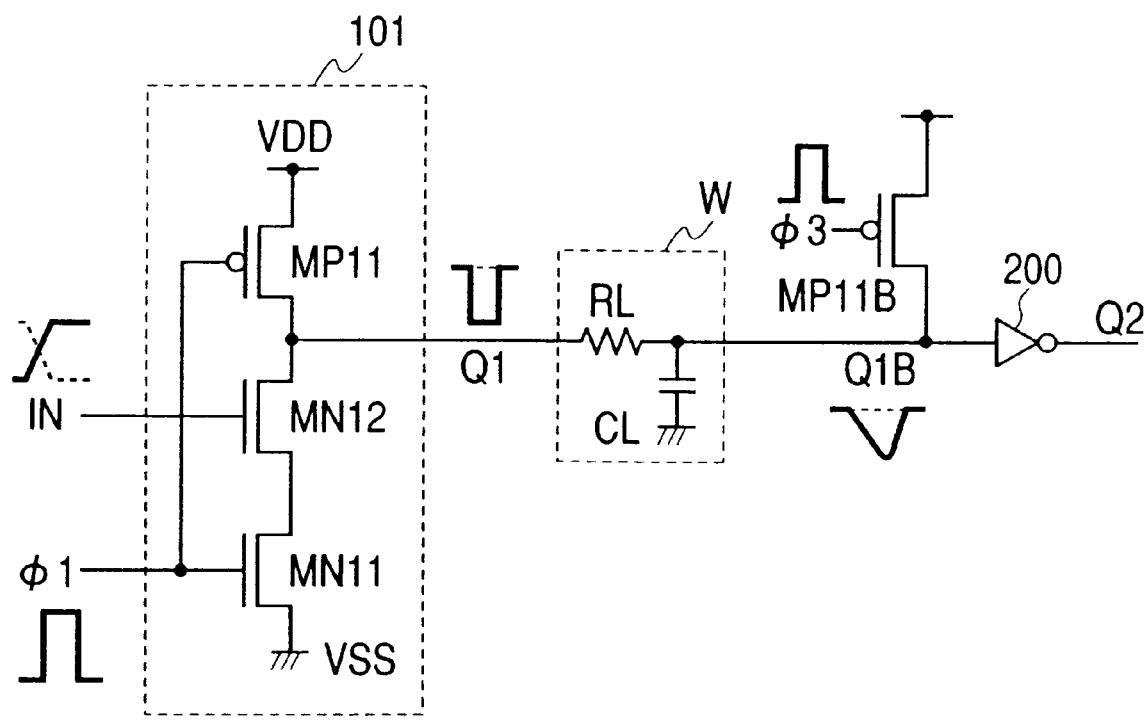
FIG. 22 is a circuit diagram showing a seventh embodiment.

FIG. 22 shows the seventh embodiment of the present invention. The present embodiment adopts a configuration in which the signal line precharge transistor MP11B is added to the input side of the receiving circuit 201, employed in the prior art shown in FIG. 18. According to the present configuration, since an advantage is obtained such that the precharge time at an exit portion of a signal wire W can be shortened while the effect of shortening the time required to transmit a data signal is not obtained, the transmission cycle time can be shortened. Thus, according to the signal line precharge transistor MP11B, the transmission cycle time can be shortened, regardless of the type of receiving circuit.

According to the present invention, even when the waveform of a signal is made dull due to a long wire, for example, it is possible to transmit data in a short time or transmit it in a high-speed cycle. It is also feasible to shorten an access time for a semiconductor memory.

While the present invention has been described with reference to the illustrative embodiments, this description is not intended to be construed in a limiting sense. Various modifications of the illustrative embodiments, as well as other embodiments of the invention, will be apparent to those skilled in the art with reference to this description. It is therefore contemplated that the appended claims will cover any such modifications or embodiments as they fall within the true scope of the invention.

What is claimed is:

1. A semiconductor memory comprising:
   a plurality of sub memory cell arrays respectively having arranged memory cells;
   main word drivers for respectively selecting rows for the memory cells;
   main word lines formed so as to pass over said plurality of sub memory array cells and driven by said main word drivers respectively; and a plurality of sub word lines allowed to branch off from said main word lines through respective sub word drivers and provided in association with said plurality of sub memory cell arrays respectively; and wherein said each main word driver is alternately controlled to a precharge period and an evaluation period according to a first control signal to thereby precharge said each main word line to a first source potential during the precharge period and drive said main word line to either the first source potential or a second source potential during the evaluation period; and said each sub word driver comprises a semiconductor logic circuit having a first node and a second node to which a corresponding one of said sub word lines is connected, said semiconductor logic circuit being alternately controlled to the precharge period and the evaluation period to thereby precharge the first and second nodes to the first source potential together during the precharge period, discharge the second node according to a potential at the first node during the evaluation period and discharge the first node according to a potential on said each main word line, thereby discriminating between the potentials on said main word lines with the potential at the first node as a reference potential and driving a corresponding one of said sub word lines.

* * * * *